(12) United States Patent
Schumacher et al.

(10) Patent No.: US 8,407,653 B1
(45) Date of Patent: Mar. 26, 2013

(54) METHOD AND SYSTEM OF ESTIMATING A DERATING FACTOR FOR SOFT ERRORS IN A CIRCUIT

(75) Inventors: Paul R. Schumacher, Berthoud, CO (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 15 days.

(21) Appl. No.: 13/217,496

(22) Filed: Aug. 25, 2011

(51) Int. Cl.
*G06F 17/50* (2006.01)
*G06F 9/455* (2006.01)
*G06F 11/22* (2006.01)
*H03K 19/007* (2006.01)
*H03K 19/003* (2006.01)
*H03K 17/16* (2006.01)

(52) U.S. Cl. .......... 716/132; 716/112; 716/136; 326/14; 326/15; 326/21

(58) Field of Classification Search .................. 716/112, 716/132, 136; 326/14, 15, 21
See application file for complete search history.

(56) References Cited

U.S. PATENT DOCUMENTS

| | | | |
|---|---|---|---|
| 6,151,568 A | 11/2000 | Allen et al. | |
| 6,345,379 B1 | 2/2002 | Khouja et al. | |
| 6,532,750 B1 | 3/2003 | Hood | |
| 6,578,178 B2 | 6/2003 | Mau | |
| 6,848,063 B2 | 1/2005 | Rodeheffer et al. | |
| 7,249,010 B1 | 7/2007 | Sundararajan et al. | |
| 7,380,197 B1 | 5/2008 | Goolsby | |
| 7,406,673 B1 | 7/2008 | Patterson et al. | |
| 7,555,741 B1 | 6/2009 | Milton et al. | |
| 7,587,620 B1 | 9/2009 | Egier et al. | |
| 7,979,835 B1 | 7/2011 | Schumacher et al. | |
| 2003/0066036 A1 | 4/2003 | Mau | |
| 2003/0097608 A1 | 5/2003 | Rodeheffer et al. | |
| 2003/0182098 A1* | 9/2003 | Ehrler | 703/19 |
| 2004/0123249 A1 | 6/2004 | Sato et al. | |
| 2006/0074589 A1* | 4/2006 | Cui et al. | 702/179 |
| 2007/0050695 A1 | 3/2007 | Schulz | |
| 2010/0005230 A1 | 1/2010 | Ho | |
| 2010/0223525 A1 | 9/2010 | Wuu et al. | |
| 2011/0145771 A1* | 6/2011 | Lamb | 716/108 |
| 2011/0208933 A1 | 8/2011 | Selfin et al. | |
| 2011/0291169 A1 | 12/2011 | Ervin et al. | |

OTHER PUBLICATIONS

U.S. Appl. No. 12/041,167, filed Mar. 3, 2008, Schumacher et al.
U.S. Appl. No. 12/398,270, filed Mar. 5, 2009, Schumacher et al.
U.S. Appl. No. 12/975,102, filed Dec. 21, 2010, Hussein et al.
Asadi, Ghazanfar et al., "Soft Error Rate Estimation and Mitigation for SRAM-Based FPGAs," *Proc. of the 13th ACM/SIGDA International Symposium on Field Programmable Gate Arrays*, Feb. 20, 2005, pp. 1-12, ACM, New York, New York, USA.

(Continued)

*Primary Examiner* — Suresh Memula
(74) *Attorney, Agent, or Firm* — LeRoy D. Maunu; Lois D. Cartier

(57) ABSTRACT

Approaches for estimating a derating factor for a plurality of potential soft errors in a circuit implementation of a circuit design. A plurality of respective estimated toggle rates are determined for a plurality of circuit elements for implementing the circuit design. A derating factor of the circuit design is determined as a function of the estimated toggle rates of the plurality of circuit elements. The derating factor is an estimation of a fraction of the plurality of potential soft errors that would cause functional failure of the circuit design.

16 Claims, 3 Drawing Sheets

OTHER PUBLICATIONS

Chapman, Ken, *SEU Strategies for Virtex-5 Devices* XAPP864 (v2.0), Apr. 1, 2010, pp. 1-16, Xilinx, Inc., San Jose, California, USA.

Chen, Deming et al., "High-Level Power Estimation and Low-Power Design Space Exploration for FPGAs," The 44th Design Automation Conference (DAC'07), Jun. 4-8, 2007, pp. 529-534, San Diego, California.

Duan, Lide et al., "Versatile Prediction and Fast Estimation of Architectural Vulnerability Factor from Processor Performance Metrics," *Proc. of the 2009 IEEE 15th International Symposium on High Performance Computer Architecture*, Feb. 14, 2009, pp. 129-140, IEEE, Piscataway, New Jersey, USA.

Hu, Ching et al., *NSEU Mitigation in Avionics Applications*, XAPP1073 (v1.0), May 17, 2010, pp. 1-12, Xilinx, Inc., San Jose, California, USA.

JEDEC Solid State Technology Association, Measurement and Reporting of Alpha Particle and Terrestrial Cosmic Ray-Induced Soft Errors in Semiconductor Devices, *JEDEC Standard JESD89A*, Oct. 2006, pp. 1-94, especially equations A-3, A-4, A-5, A-6 and A-7, and table A.3-C in Annex A, JEDEC Solid State Technology Association, Arlington, Virginia, USA.

Li, Xiaodong et al., "Online Estimation of Architectural Vulnerability Factor for Soft Errors " *Proc. of the 35th Annual International Symposium on Computer Architecture*, Jun. 21, 2008, pp. 1-12, IEEE Computer Society, Washington, DC, USA.

Mukherjee, Shubhendu S. et al., "A Systematic Methodology to Compute the Architectural Vulnerability Factors for a High-Performance Microprocesor " *Proc. of the IEEE/ACM 36th Annual International Symposium on Microarchitecture*, Dec. 3, 2003, pp. 29-40, IEEE, Piscataway, New Jersey, USA.

Sundararajan, Prasanna, "Estimation of Single Event Upset Probability Impact of FPGA Designs," *Proc. of the 6th Annual International Conference on Military and Aerospace Programmable Logic Devices*, Sep. 9, 2003, pp. 1-4.

Xilinx, Inc., *Device Reliability Report*, UG116 (v5.11), Nov. 1, 2010, pp. 1-110, especially Table 1-15, "Real Time Soft Error Rates," Xilinx, Inc., San Jose, California, USA.

\* cited by examiner

METHOD AND SYSTEM OF ESTIMATING A DERATING FACTOR FOR SOFT ERRORS IN A CIRCUIT

FIELD OF THE INVENTION

One or more embodiments generally relate to soft errors in integrated circuits, and more particularly to estimating an effective rate of soft errors causing functional failure.

BACKGROUND

Cosmic radiation includes high-energy atomic particles that produce neutrons upon collision with atoms in the Earth's atmosphere. When these neutrons strike an integrated circuit device, the secondary spallation products from the neutrons colliding with a silicon or other atom in the device creates a trail of hole and electron pairs in the substrate of the integrated circuit. A circuit node of the integrated circuit can collect the holes or the electrons. If a storage node collects enough charge from the holes or from the electrons, the collected charge can corrupt the value stored by the storage node. This corruption of a storage node is referred to as a "soft error," because the integrated circuit may operate properly after a reset and/or correction of the corrupted value.

Various techniques permit mitigation of soft errors. However, these techniques are difficult and time consuming to implement, and these techniques are often especially difficult and time consuming to implement without seriously impacting system functionality. In addition, many soft errors are benign because the integrated circuit does not operate improperly after these soft errors. However, existing techniques are extremely inaccurate in estimating benign soft errors. Thus, to ensure a targeted level of reliability, soft error mitigation may needlessly mitigate many benign soft errors.

SUMMARY

In one embodiment, a method is provided for estimating a derating factor for a plurality of potential soft errors in a circuit implementation of a circuit design. The method includes determining, by a computing arrangement, a plurality of respective estimated toggle rates for a plurality of circuit elements for implementing the circuit design. A derating factor of the circuit design is determined as a function of the estimated toggle rates of the plurality of circuit elements. The derating factor is an estimation of a fraction of the plurality of potential soft errors that would cause functional failure of the circuit design. Data indicative of the derating factor is output.

In another embodiment, a method of estimating a derating factor for a plurality of potential soft errors in a circuit implementation of a circuit design includes storing a representation of the circuit design. The representation specifies a plurality of circuit elements for implementing the circuit design. The plurality of circuit elements is matched to a plurality of structural templates by a computing arrangement. Each structural template is representative of one or more of the plurality of circuit elements and has associated information descriptive of one or more toggle rates. A plurality of respective estimated toggle rates for the plurality of circuit elements of the circuit design is determined based on the information descriptive of one or more toggle rates associated with the matched structural templates. A derating factor of the circuit design is determined as a function of the estimated toggle rates of the plurality of circuit elements. The derating factor is an estimation of a fraction of the plurality of potential soft errors that would cause functional failure of the circuit design. Data indicative of the derating factor is output.

A system for estimating a derating factor for a plurality of potential soft errors in a circuit implementation of a circuit design is provided in another embodiment. The system includes at least one processor and a storage arrangement coupled to the processor. The storage arrangement has stored therein instructions and a representation of the circuit design. The representation specifies a plurality of circuit elements for implementing the circuit design. The instructions when executed by the processor cause the processor to perform the operations including matching the plurality of circuit elements to a plurality of structural templates. Each structural template is representative of one or more of the plurality of circuit elements and has associated information descriptive of one or more toggle rates. The operations further include determining a plurality of respective estimated toggle rates for the plurality of circuit elements of the circuit design based on the information descriptive of one or more toggle rates associated with the matched structural templates. A derating factor of the circuit design is determined as a function of the estimated toggle rates of the plurality of circuit elements. The derating factor is an estimation of a fraction of the plurality of potential soft errors that would cause functional failure of the circuit design. Data indicative of the derating factor is output.

It will be appreciated that various other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

Figure 1:
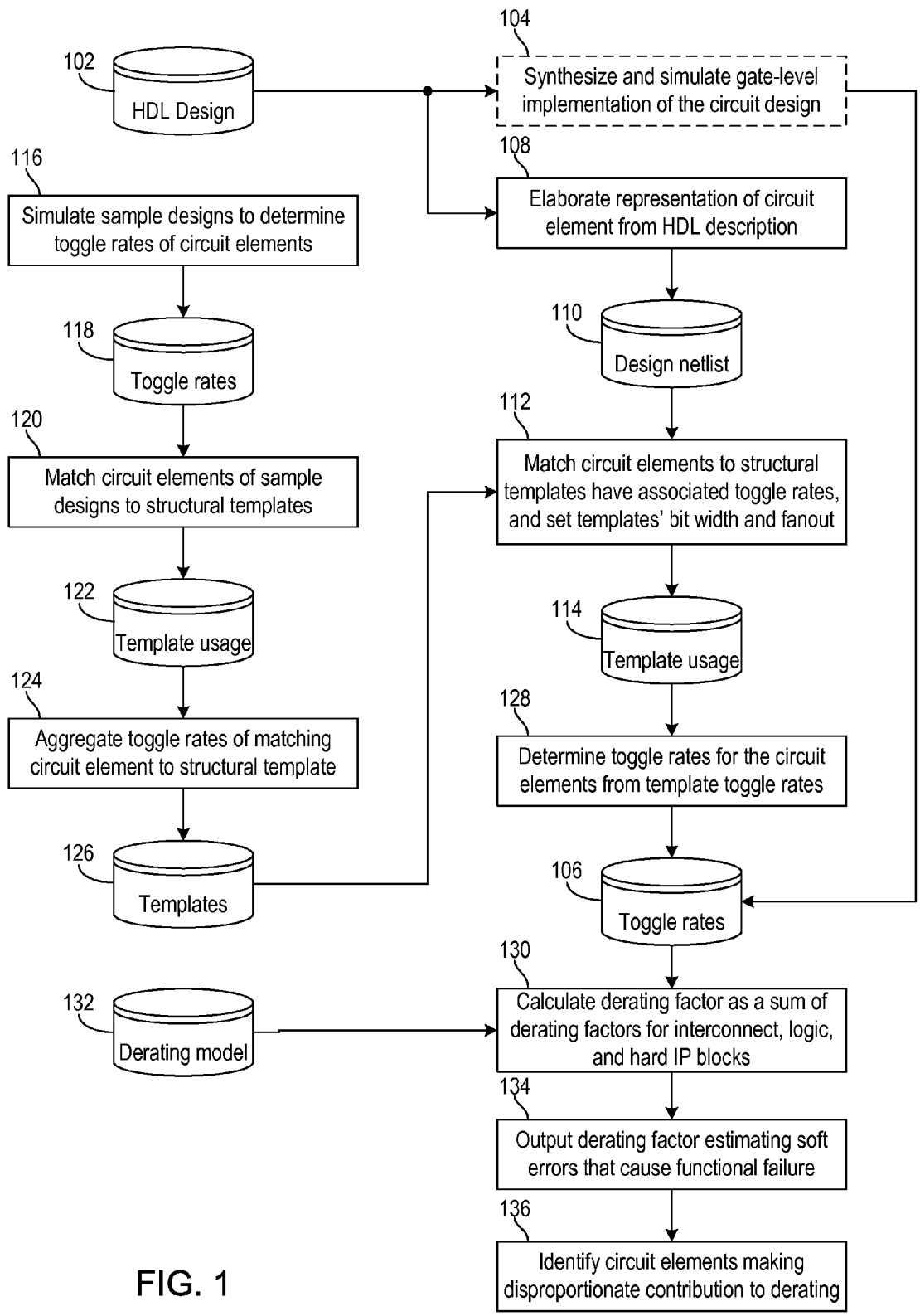
FIG. 1 is a data flow diagram of a process for estimating a derating factor for the potential soft errors in a circuit implementation of a circuit design.

FIG. 1 is a data flow diagram of a process for estimating a derating factor for the potential soft errors in a circuit implementation of a circuit design. The derating factor is an estimation of the fraction of the potential soft errors that would cause functional failure of the circuit design. This derating factor is also known as an architectural vulnerability factor.

In one embodiment, the circuit implementation is synthesized from a representation of the circuit design in a hardware description language at optional block 104. The circuit implementation specifies the circuit design in circuit elements that are gate-level primitives. At optional block 104, the operation of the circuit implementation is simulated to generate estimated toggle rates 106 for the circuit elements.

In another embodiment, the derating factor is quickly estimated directly from a representation 102 of the circuit design in a hardware description language. The derating factor is estimated from the representation 102 without actually generating a circuit implementation of the circuit design. Instead of generating a circuit implementation of the circuit design, circuit elements of the circuit design are matched with pre-characterized structural templates. When the reliability predicted from the derating factor does not meet a targeted reliability, a designer can modify the circuit design early in the design process, such as before any circuit implementation of the circuit design is generated.

At block 108, a parser/elaborator is run on a source code representation 102 of the circuit design to determine the circuit elements that implement the circuit design. A resource estimator operates on those circuit elements to estimate the hardware resources for those elements. This produces a design netlist 110 that specifies the circuit elements for implementing the circuit design and an estimation of the hardware resources needed to implement those circuit elements. In one embodiment, the hardware resources are gate-level primitives, and the circuit elements are high-level circuit components, such as multiplexers, comparators, adders, registers, and memories. It is important to note that one embodiment estimates the derating factor from the design netlist 110 regardless of how the representation 102 circuit design is converted to the design netlist 110. For example, netlist 110 may be generated directly from the representation 102, which is a representation in a high level language (HLL) or a register transfer language (RTL), or some other representation of the circuit design other than an HLL or RTL representation.

The design netlist 110 contains information regarding content as well as structural information and connectivity for a circuit design. More particularly, a net of a design netlist 110 represents a collection of interconnect lines from the output of a circuit element to the inputs of the destination circuit element or elements, and a path represents a sequence of nets between registers and comprises a connection from a source to a specific destination. A path may be defined as a clock-to-clock path, such as one register to another register, a register to an output, an input to a register, or an input to an output, as is well known in the art. Accordingly, the methods described herein involve creating a mid-level view of a circuit design, by describing the circuit design in terms of a library of well-known, parameterizable circuit elements of the design netlist 110. The circuit elements of the design netlist 110 are preferably at a level which enables generating a derating estimate in terms of the resources of a targeted device.

The design netlist 110 also contains IP cores in one embodiment. An IP core is a larger, pre-defined function, which is typically selected from a library of IP cores by a designer in preparing a large design. That is, an IP core comprises a plurality of circuit elements normally found in a netlist. Examples of IP cores include finite impulse response (FIR) filters and fast Fourier transform (FFT) cores, each of which may comprise a large number of circuit elements found in a netlist. That is, when a circuit designer needs the functionality of a FIR circuit or an FFT circuit, it is possible to select an IP core for those circuits which are predefined and ready to implement.

At block 112, the circuit elements of the circuit design are matched to pre-characterized structural templates. Each structural template is representative of one or more circuit elements and has associated information descriptive of one or more toggle rates. In one embodiment, the circuit elements of the circuit design are partitioned into disjoint subsets, and each disjoint subset is matched to a respective one of the structural templates.

In one embodiment, one or more characteristics of the respective structural template for each disjoint subset are set as a function of those circuit elements in the disjoint subset. In one example, the structural templates include a barrel shifter, a multiplier accumulator (MACC), a memory, a finite state machine, and a counter. Each of these structural templates has a bit width specifying, for example, a width of the barrel shifter, a precision of the MACC, a width of an address and/or data bus of the memory, a number of states in the finite state machine, and a maximum count of the counter. In another example, each structural template has a fanout characteristic. The bit width characteristic of the structural template is set a width of the matching circuit elements in the disjoint subset for the structural template, and the fanout of the structural template is set to a total fanout of the circuit elements in the disjoint subset for the structural template.

In one embodiment, structural analysis correlates the circuit elements in design netlist 110 with the pre-characterized structural templates 126. In one example, the template matching occurs at multiple levels of the circuit design. In another example, a design structure containing multiple elements is collectively matched to a pre-characterized template (e.g., a finite state machine). Thus, template matching is performed by structural analysis on all hierarchical levels of the design, identifying and using groups of circuit elements where applicable. For those circuit elements that do not match any structural template 126, toggle rates of other circuit elements having outputs connected to the inputs of those circuit elements are propagated and associated with those circuit elements.

A template usage database 114 specifies each matching structural template, including the associated toggle rate or rates, the characteristics, and the estimation of the hardware resources needed to implement the circuit elements matched to the structural template. It will be appreciated that a particular structural template, such as a counter, often matches multiple disjoint subsets of the circuit elements, and the template usage database 114 includes separate instances of the particular structural template with each instance including the associated toggle rate or rates, the characteristics, and needed the hardware resources.

Next, the pre-characterization of the structural templates is discussed, followed by a discussion of how the derating factor is generated from the matching structural templates. The pre-characterized structural templates and associated toggle rates are generated from a set of sample circuit designs of various types and sizes. The pre-characterized structural templates generalize various types and sizes of common combinations of circuit elements (e.g., finite state machines, data processing engines, communication elements, counters, and barrel shifters). Unique characteristics of these combinations are specified by the pre-characterized structural templates, so that those characteristics may be matched to circuit elements in a circuit design to be analyzed. For example, a finite state machine may contain a particular combination of comparators, multiplexers, and registers, and that particular combination is specified in a structural template. In one embodiment, the structural templates include additional information describing the included circuit elements. Using a counter as an example of a common combination of circuit elements, possible characteristics include: bit width, step size, clock enable existence and toggle rate, and type (e.g., up, down, up-down). The structural template for the counter would indicate it is composed of an adder and/or subtractor, a representation of a constant (e.g., ties to ground and power), multiplexers, an N-bit register, and various connections between these circuit elements.

At block 116, implementations of the sample circuit designs are synthesized and simulated to generate the toggle rates for the relevant circuit elements in each sample circuit design. In one embodiment, the sample circuit designs are implemented in the programmable logic and interconnect resources of a programmable integrated circuit. When implementing the sample circuit designs in a programmable integrated circuit, it is necessary to map, pack, place, and route each sample circuit design, as is well known in the art. That is, each sample circuit design is mapped to certain elements of programmable logic and interconnect resources. The various circuits are packed into blocks and placed at certain locations of the programmable integrated circuit, and the interconnections are routed between the packed and placed blocks. These pre-characterization steps, and more particularly placement and routing, are often time consuming and require engineering and computer resources. However, these pre-characterization steps are completed before the analysis of the circuit design with representation 102. Finally, various test vectors are applied to the implemented sample circuit designs during simulation to calculate the toggle rates 118 of its circuit elements.

At block 120, for each sample circuit design, the respective circuit elements of the sample circuit design are matched to the structural templates. In one embodiment, the matching performed at block 120 for each sample circuit design is the same matching performed at block 112 for the input circuit design having representation 102.

The simulated toggle rates for the sample circuit design are stored in association with the proper structural templates in template usage database 122. The template usage database 122 specifies the matching structural templates for the sample circuit designs, including the simulated toggle rate or rates and the template characteristics.

At block 124, all of the toggle rates of the circuit elements matching each structural template are combined into an aggregated toggle rate or rates associated with the structural template. In one embodiment, the aggregated toggle rates for a particular structural template are an average, such as a mean or median, of the toggle rates of circuit elements matched to this particular structural template. In another embodiment, other well known techniques such as curve fitting can be used to characterize a toggle rate for a structural template. This may be necessary if too many structural templates are required to cover all possible combinations of matching circuit elements. For example, the use of curve fitting can reduce the toggle rate characterization to an equation based on type and size parameters (e.g., number of inputs and states of a finite state machine). Different state machine designs (having different numbers of inputs, states, etc.) may be simulated and characterized to yield a corresponding empirical version of this equation. The equation is then stored with templates 126 as the associated information descriptive of the one or more toggle rates of the structural template.

Returning to block 112, the circuit elements of the circuit design are matched to pre-characterized structural templates from templates 126. At block 128, the toggle rate or rates of the circuit elements of the analyzed circuit design are estimated based on the information descriptive of one or more toggle rates associated with the matched structural templates. If an equation is associated with a structural template matched to a set of circuit elements, then the equation gives the toggle rate or toggle rates of this set of circuit elements after evaluating the equation with the characteristics, such as type and size parameters, of this set of circuit elements. This produces the estimated toggle rates 106 for the circuit elements of the circuit design with representation 102.

In one embodiment, additional information is input to estimate the toggle rates 106. This information includes, for example, clock domains of the circuit design, fanout statistics, number and type of input/output (I/O) pins, estimated hardware part type based on estimation totals (if not specified by the designer) and other similar characteristics. In addition, the designer may be asked to provide clock frequencies and input pin toggle rates.

Alternatively, clock domains are automatically determined by identifying the appropriate clock signal for all synchronous elements in the design (e.g., registers, memories), and associating a clock domain with all elements in the paths between the synchronous elements for each clock signal.

Fanouts are determined for all levels of the hierarchy by finding the number of loads of each net. A load depends upon the resource estimation for every connection in the design netlist 110. In an embodiment implementing the circuit design in a programmable integrated circuit, a distinction is made between connections that use programmable interconnect resources and connections that most likely use a local connection, such as a connection between a lookup table and a flip-flop within a configurable logic block of an FPGA.

Based upon the resource estimation results, a specific, ideal part type is identified. The designer may or may not specify the specific family (or sets of families) of parts from which the part is identified. The part identification may also be influenced by the fanout information above, which may influence the routability of the design.

At block 130, the derating factor of the circuit design with representation 102 is determined as a function of the estimated toggle rates 106. The derating model 132 specifies the calculation of the derating factor. It was discovered that a particular derating model determines the derating factor with an accuracy of twenty percent even when the toggle rates of the circuit elements are estimated via the previously discussed template matching. In contrast, prior techniques for estimating the derating factor were accurate to about an order of magnitude and required an actual circuit implementation of the circuit design. Because certain embodiments estimate the derating factor without the time consuming generation of a circuit implementation, these embodiments quickly and accurately estimate the derating factor from the representation 102. In one embodiment, the derating model 132 specifies that the derating factor is a weighted sum of derating factors associated with interconnect, logic, and hard IP blocks (e.g., DSP blocks, transceivers, etc.) on the targeted device. The interconnect derating factor is a function of the total fanout of the circuit elements, and the logic derating factor sums the respective estimated toggle rates over the estimated resources for implementing the circuit elements. In alternative embodiments, routing resource usage may be estimated according to slice packing efficiency, bit widths of elements including registers, number of control sets (i.e., set/reset, clock enable), and number of clocks, for example.

When a circuit element outputs values that toggle infrequently, downstream circuits often ignore these values during clock cycles between the infrequent toggles. Thus, functionality is unaffected by soft errors that cause value corruption during an ignored clock cycle. In addition, soft errors occurring during a transition are more likely to corrupt the value sampled at the input of a register. Thus, register inputs that transition frequently are more likely to become corrupted.

In one embodiment, disjoint subsets of the circuit elements are matched to the structural templates as previously discussed. The interconnect derating factor is estimated as a function of the fanout of the respective structural template for each disjoint subset, and the logic derating factor is estimated as a function of the bit width and the information descriptive of the one or more toggle rates of the respective structural template for each disjoint subset. The derating factor is calculated as a weighted sum of the interconnect derating factor and the logic derating factor. While the interconnect derating factor could be estimated as a function of the toggle rates, this may not improve the accuracy of the overall derating factor.

In one embodiment, the circuit design is implemented in a programmable integrated circuit having hardware resources including programmable interconnect elements and the programmable logic elements. This embodiment estimates the programmable interconnect elements and the programmable logic elements needed to implement the circuit elements of the circuit design. The derating factor is calculated as a weighted sum of an interconnect derating factor for the programmable interconnect elements and a logic derating factor for the programmable logic elements. The interconnect derating factor enumerates the programmable interconnect elements needed to implement the circuit design, and the logic derating factor sums the respective estimated toggle rates of the programmable logic elements needed to implement the circuit design. The programmable integrated circuit also includes a configuration memory for configuring the programmable interconnect elements and the programmable logic elements to implement various circuit designs. The derating factor is an estimation of the fraction of the potential soft errors in the configuration memory that would cause the functional failure that programmable interconnect elements and the programmable logic elements no longer implement the circuit design with representation 102.

At block 134, data indicative of the derating factor is output. The derating factor estimates a fraction of the potential soft errors that cause functional failure of the circuit design. The output may be to a display, to a storage device, or to other processes on the same or different computing arrangement.

At block 136, those circuit elements that disproportionately contribute to the derating factor are identified. A designer could modify these circuit elements to improve the derating factor of the circuit design. Because the derating factor is accurately estimated and relayed back to the designer early in the design process before generating any circuit implementation in one embodiment, the designer can mitigate the effects of soft errors without needlessly mitigating many benign soft errors. One embodiment includes automatic mitigation of soft errors in circuit elements that disproportionately contribute to the derating factor. In one example, the required timing margin is increased for circuit elements that have a high toggle rate and that disproportionately contribute to the derating factor. This might reduce the vulnerability of these circuit elements to soft errors.

Figure 2:
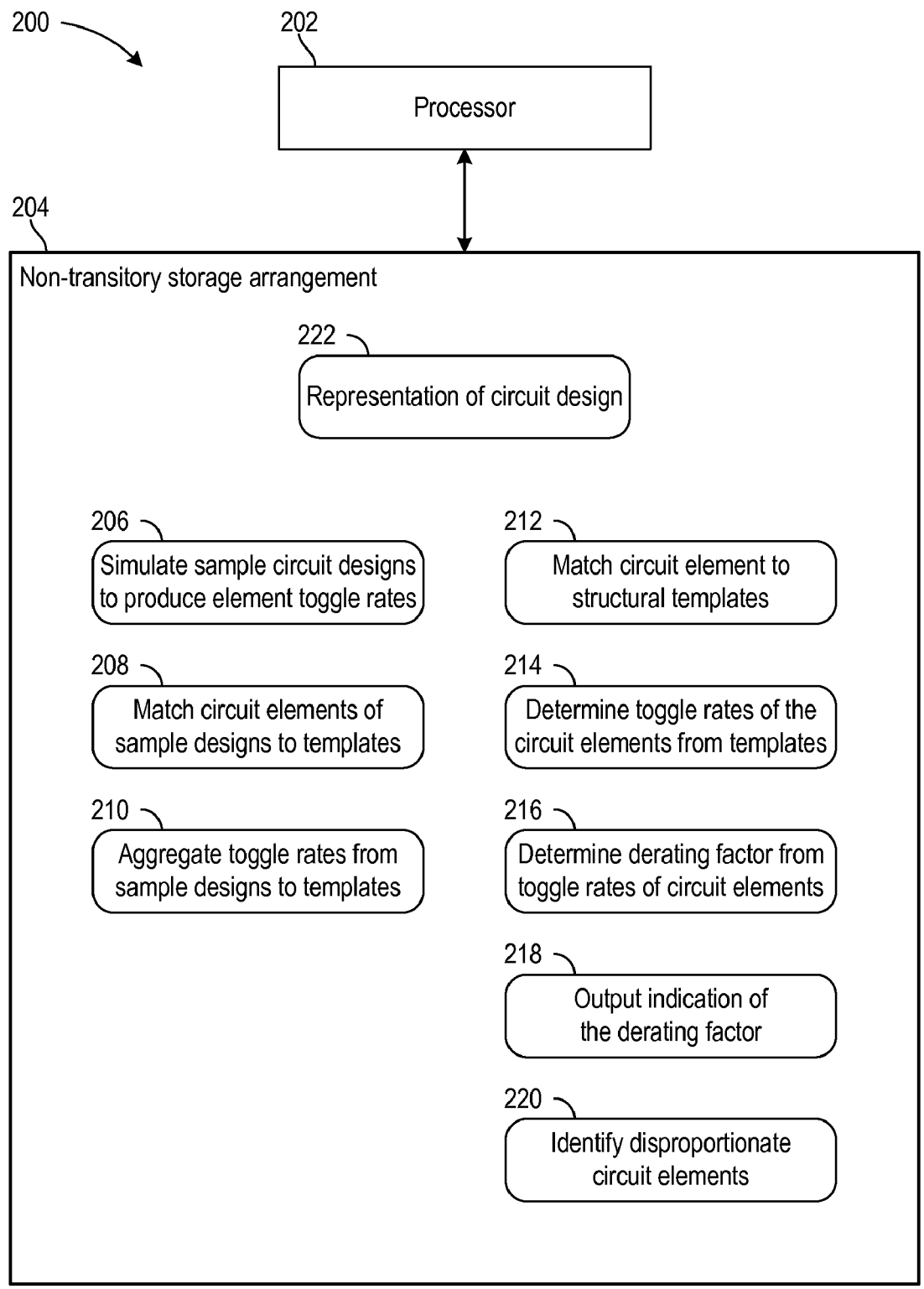
FIG. 2 is a block diagram of a computing arrangement for estimating a derating factor for the potential soft errors in a circuit implementation of a circuit design.

FIG. 2 is a block diagram of a computing arrangement 200 for estimating a derating factor for the potential soft errors in a circuit implementation of a circuit design. Those skilled in the art will appreciate that various alternative computing arrangements, including one or more processors and a memory arrangement configured with program code, would be suitable for hosting the processes and data structures and implementing the algorithms of the different embodiments described herein. In addition, program code that implements the processes may be provided via a variety of computer-readable storage media or delivery channels such as magnetic or optical disks or tapes, electronic storage devices, or as application services over a network.

Computing arrangement 200 includes a processor 202 or processors coupled to non-transitory storage arrangement 204. The architecture of the computing arrangement depends on implementation requirements as would be recognized by those skilled in the art. The processor 202 may be one or more general-purpose processors, or a combination of one or more general purpose processors and suitable co-processors, or one or more specialized processors (e.g., RISC, pipelined, etc.).

The memory/storage arrangement 204 is representative of hierarchical storage commonly found in computing arrangements. Such hierarchical storage typically includes multiple levels of cache memory, a main memory, and local and/or remote persistent storage such as provided by magnetic disks (not shown). The memory/storage arrangement may include one or both of local and remote memory/storage, remote storage being coupled to the processor arrangement via a local area network, for example.

The processor 202 executes the instructions in the software modules 206, 208, 210, 212, 214, 216, 218, and 220 stored in memory/storage arrangement 204. Execution of the instructions in these software modules cause processor 202 to perform various operations. The processor 202 reads data from and stores data to the memory/storage arrangement 204, and this data includes a representation 222 that specifies the circuit elements for implementing the circuit design. An operating system (not shown) manages the resources of the computing arrangement 200.

Execution of the instructions in software module 206 causes processor 202 to simulate various sample circuit designs for generating a toggle rate for each circuit element of each sample circuit design. Execution of the instructions in software module 208 causes processor 202 to match the circuit elements of each sample circuit design to the structural templates. Execution of the instructions in software module 210 causes processor 202 to aggregate together the toggle rates of the circuit elements matched to each structural template, and to associate the aggregated toggle rate or rates with the structural template.

Execution of the instructions in software module 212 causes processor 202 to match the circuit elements of the input circuit design to the structural templates. Each structural template represents of one or more of the circuit elements and has associated information descriptive of one or more toggle rates of these circuit elements.

In one embodiment, disjoint subsets of the circuit elements are each matched to a respective one of the structural templates. One or more characteristics of the respective structural template for each disjoint subset are set as a function of those circuit elements in the disjoint subset. These characteristics include either a bit width or a fanout of the respective structural template.

Execution of the instructions in software module 214 causes processor 202 to determine respective estimated toggle rates for the circuit elements of the circuit design based on the information descriptive of one or more toggle rates associated with the matched structural templates. The estimated toggle rates may be stored in the memory/storage arrangement 204.

Execution of the instructions in software module 216 causes processor 202 to determine the derating factor of the circuit design as a function of the estimated toggle rates of the circuit elements.

In one embodiment, an interconnect derating factor is estimated as a function of the fanout of the respective structural template that matches each disjoint subset of the circuit elements, and a logic derating factor is estimated as a function of the bit width and the information descriptive of the one or more toggle rates of the respective structural template matching each disjoint subset of the circuit elements. The derating factor is calculated as a weighted sum of the interconnect derating factor and the logic derating factor, with the interconnect derating factor having about three times the weight of the logic derating factor.

In one embodiment, an estimate is generated for the programmable interconnect elements and the programmable logic elements needed to implement the circuit elements of the circuit design. The derating factor is calculated as a weighted sum of an interconnect derating factor enumerating the programmable interconnect elements and a logic derating factor summing the estimated toggle rates of the programmable logic elements.

Execution of the instructions in software module 218 causes processor 202 to output data indicative of the derating factor. The derating factor estimates a fraction of the potential soft errors that cause functional failure of the circuit design. The derating factor may also be stored in the memory/storage arrangement 204.

Execution of the instructions in software module 218 causes processor 202 to identify those of the plurality of circuit elements that disproportionately contribute to the derating factor of the circuit design.

Figure 3:
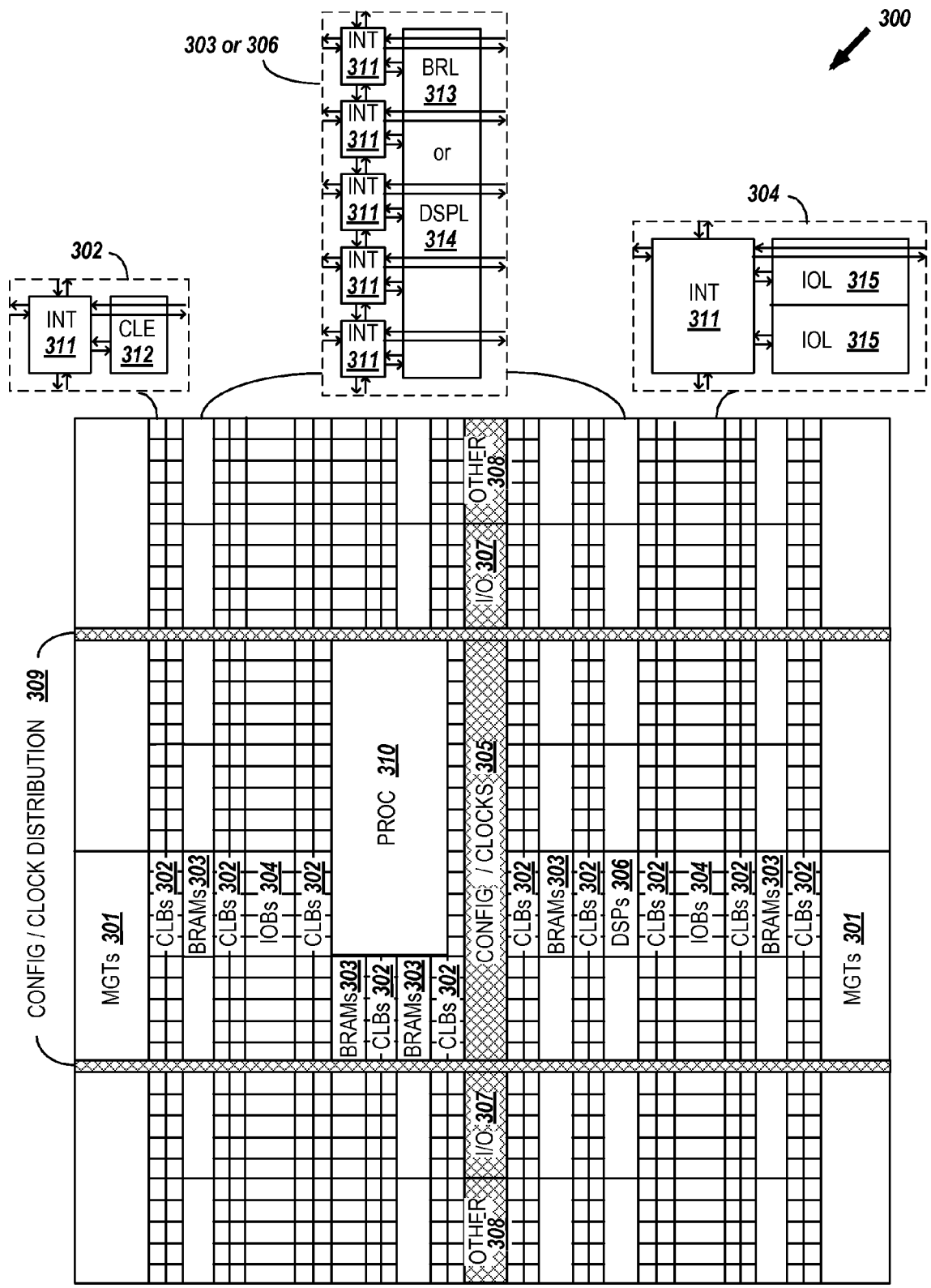
FIG. 3 is a block diagram of an example programmable integrated circuit for which a derating factor is estimated.

FIG. 3 is a block diagram of an example programmable integrated circuit for which a derating factor may be estimated for a circuit implemented on the programmable integrated circuit. The illustrated programmable integrated circuit is referred to as a Field Programmable Gate Array (FPGA). FPGAs can include several different types of programmable logic blocks in the array. For example, FIG. 3 illustrates an FPGA architecture (300) that includes a large number of different programmable resources including multi-gigabit transceivers (MGTs) 301, configurable logic blocks (CLBs) 302, random access memory blocks (BRAMs) 303, input/output blocks (IOBs) 304, configuration and clocking logic (CONFIG/CLOCKS) 305, digital signal processing blocks (DSPs) 306, specialized input/output blocks (I/O) 307, for example, e.g., clock ports, and other programmable logic 308 such as digital clock managers, analog-to-digital converters, system monitoring logic, and so forth. Some FPGAs also include dedicated processor blocks (PROC) 310 and internal and external reconfiguration ports (not shown).

In some FPGAs, each programmable tile includes a programmable interconnect element (INT) 311 having standardized connections to and from a corresponding interconnect element in each adjacent tile. Therefore, the programmable interconnect elements taken together implement the programmable interconnect structure for the illustrated FPGA. The INT 311 also includes the connections to and from the programmable logic element within the same tile, as shown by the examples included at the top of FIG. 3. For example, a CLB 302 can include a configurable logic element (CLE) 312 that can be programmed to implement user logic plus a single INT 311. A BRAM 303 can include a BRAM logic element (BRL) 313 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 306 can include a DSP logic element (DSPL) 314 in addition to an appropriate number of programmable interconnect elements. An IOB 304 can include, for example, two instances of an input/output logic element (IOL) 315 in addition to one instance of the INT 311. As will be clear to those of skill in the art, the actual I/O pads connected, for example, to the IOL 315 are manufactured using metal layered above the various illustrated logic blocks, and typically are not confined to the area of the IOL 315.

In the pictured embodiment, a columnar area near the center of the die (shown shaded in FIG. 3) is used for configuration, clock, and other control logic. Horizontal areas 309 extending from this column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic.

In one embodiment, an interconnect derating factor estimates the likelihood that a soft error in the configuration memory causes the functional failure that the INTs 311 no longer implement the circuit design. In this embodiment, a logic derating factor estimates the likelihood that a soft error in the configuration memory causes the functional failure that the programmable logic elements, which include CLBs 302, IOBs 304, and DSPs 306, no longer implement the circuit design. Because the CLBs 302 are highly configurable and the IOBs 304 and DSPs 306 are less configurable, the logic derating factor is usually dominated by the potential soft errors in the configuration memory for the CLBs 302. The logic derating factor can also cover soft errors in the BRAMs 303. However, design circuits usually include correction circuits that mask soft errors in the BRAMs 303 using an error correcting code.

The embodiments are thought to be applicable to a variety of systems for estimating derating factors. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A method of estimating a derating factor for a plurality of potential soft errors in a circuit implementation of a circuit design, the method comprising:
   storing a representation of the circuit design, the representation specifying a plurality of circuit elements for implementing the circuit design;
   matching the plurality of circuit elements to a plurality of structural templates by a computing arrangement, each structural template being representative of one or more of the plurality of circuit elements and having associated information descriptive of one or more toggle rates;
   determining, by the computing arrangement, a plurality of respective estimated toggle rates for the plurality of circuit elements of the circuit design based on the information descriptive of one or more toggle rates associated with the matched structural templates;
   determining, by the computing arrangement, a derating factor of the circuit design as a function of the estimated toggle rates of the plurality of circuit elements, wherein the derating factor is an estimation of a fraction of the plurality of potential soft errors that would cause functional failure of the circuit design; and
   outputting data indicative of the derating factor.

2. The method of claim 1, further comprising:

simulating each sample circuit design of a plurality of sample circuit designs, wherein the simulating generates a toggle rate for each circuit element of the sample circuit design;

matching, for each sample circuit design of the plurality of sample circuit designs, a respective plurality of circuit elements of the sample circuit design to the plurality of structural templates; and aggregating, for each structural template of the plurality of structural templates, the one or more toggle rates associated with the structural template from the toggle rate of each circuit element matched to the structural template in each sample circuit design.

3. The method of claim 1, further comprising:

simulating each sample circuit design of a plurality of sample circuit designs, wherein the simulating generates a toggle rate for each circuit element of the sample circuit design;

matching, for each sample circuit design of the plurality of sample circuit designs, a respective plurality of circuit elements of the sample circuit design to the plurality of structural templates;

determining, for each structural template of the plurality of structural templates, an equation of the structural template from the toggle rate of each circuit element matched to the structural template in each sample circuit design; and storing the equation for each structural template as the associated information descriptive of the one or more toggle rates of the structural template.

4. The method of claim 1, wherein the plurality of structural templates include a barrel shifter, a multiplier accumulator (MACC), a memory, a finite state machine, and a counter.

5. The method of claim 1, wherein the plurality of circuit elements matched to a plurality of structural templates include a multiplexer, a comparator, an adder, a register, and a memory.

6. The method of claim 1, wherein the matching of the plurality of circuit elements to a plurality of structural templates includes:

matching each of a plurality of disjoint subsets of the plurality of circuit elements to a respective structural template of the plurality of structural templates;

setting at least one characteristic of the respective structural template for each disjoint subset as a function of each circuit element in the disjoint subset; and wherein the at least one characteristic includes at least one of a bit width or a fanout of the respective structural template.

7. The method of claim 6, wherein the determining of the derating factor includes:

estimating an interconnect derating factor as a function of the fanout of the respective structural template for each of the plurality of disjoint subsets;

estimating a logic derating factor as a function of the bit width and the information descriptive of the one or more toggle rates of the respective structural template for each of the plurality of disjoint subsets; and calculating the derating factor as a weighted sum of the interconnect derating factor and the logic derating factor.

8. The method of claim 1, wherein the determining of the derating factor includes:

estimating a plurality of programmable interconnect elements and a plurality of programmable logic elements that implement the plurality of circuit elements of the circuit design;

calculating the derating factor as a weighted sum of an interconnect derating factor for the plurality of programmable interconnect elements and a logic derating factor for the plurality of programmable logic elements; and wherein the interconnect derating factor is an enumeration of the plurality of programmable interconnect elements, and the logic derating factor sums the respective estimated toggle rates of the plurality of programmable logic elements.

9. The method of claim 8, wherein:

the plurality of programmable interconnect elements and the plurality of programmable logic elements are included in a programmable integrated circuit that includes a configuration memory for configuring the plurality of programmable interconnect elements and the plurality of programmable logic elements; and the derating factor is an estimation of the fraction of the plurality of potential soft errors in the configuration memory that would cause the functional failure that the plurality of programmable interconnect elements and the plurality of programmable logic elements no longer implement the plurality of circuit elements of the circuit design.

10. The method of claim 1, further comprising identifying those of the plurality of circuit elements that disproportionately contribute to the derating factor of the circuit design.

11. A system for estimating a derating factor for a plurality of potential soft errors in a circuit implementation of a circuit design, comprising:

at least one processor; and a storage arrangement coupled to the at least one processor, wherein the storage arrangement has stored therein instructions and a representation of the circuit design, the representation specifying a plurality of circuit elements for implementing the circuit design, wherein the instructions when executed by the at least one processor cause the at least one processor to perform operations including:

matching the plurality of circuit elements to a plurality of structural templates, each structural template being representative of one or more of the plurality of circuit elements and having associated information descriptive of one or more toggle rates;

determining a plurality of respective estimated toggle rates for the plurality of circuit elements of the circuit design based on the information descriptive of one or more toggle rates associated with the matched structural templates;

determining a derating factor of the circuit design as a function of the estimated toggle rates of the plurality of circuit elements, wherein the derating factor is an estimation of a fraction of the plurality of potential soft errors that would cause functional failure of the circuit design; and outputting data indicative of the derating factor.

12. The system of system 11, wherein the operations further include:

simulating each sample circuit design of the plurality of sample circuit designs, wherein the simulating generates a toggle rate for each circuit element of the sample circuit design;

matching, for each sample circuit design of a plurality of sample circuit designs, a respective plurality of circuit elements of the sample circuit design to the plurality of structural templates; and aggregating, for each structural template of the plurality of structural templates, the one or more toggle rates associated with the structural template from the toggle rate of each circuit element matched to the structural template in each sample circuit design.

13. The system of system 11, wherein the matching of the plurality of circuit elements to a plurality of structural templates includes:

matching each of a plurality of disjoint subsets of the plurality of circuit elements to a respective structural template of the plurality of structural templates;

setting at least one characteristic of the respective structural template for each disjoint subset as a function of each circuit element in the disjoint subset; and wherein the at least one characteristic includes at least one of a bit width or a fanout of the respective structural template.

14. The system of system 13, wherein the determining of the derating factor includes:

estimating an interconnect derating factor as a function of the fanout of the respective structural template for each of the plurality of disjoint subsets;

estimating a logic derating factor as a function of the bit width and the information descriptive of the one or more toggle rates of the respective structural template for each of the plurality of disjoint subsets; and calculating the derating factor as a weighted sum of the interconnect derating factor and the logic derating factor.

15. The system of system 11, wherein the determining of the derating factor includes:

estimating a plurality of programmable interconnect elements and a plurality of programmable logic elements that implement the plurality of circuit elements of the circuit design;

calculating the derating factor as a weighted sum of an interconnect derating factor for the plurality of programmable interconnect elements and a logic derating factor for the plurality of programmable logic elements; and wherein the interconnect derating factor enumerates the plurality of programmable interconnect elements, and the logic derating factor sums the respective estimated toggle rates of the plurality of programmable logic elements.

16. The system of system 11, wherein the operations further include identifying those of the plurality of circuit elements that disproportionately contribute to the derating factor of the circuit design.

* * * * *